US012575232B2

(12) United States Patent
Zhao et al.

(10) Patent No.: US 12,575,232 B2
(45) Date of Patent: Mar. 10, 2026

(54) LIGHT EMITTING DEVICE HAVING A REFLECTIVE LAYER COMPRISING ATOMIC CRYSTAL MATERIAL AND PREPARATION METHOD THEREOF, LIGHT EMITTING SUBSTRATE AND PREPARATION METHOD THEREOF

(71) Applicants: BOE MLED Technology Co., Ltd., Beijing (CN); BOE Technology Group Co., Ltd., Beijing (CN)

(72) Inventors: Jiawei Zhao, Beijing (CN); Junjie Ma, Beijing (CN); Zhijun Xiong, Beijing (CN); Shanwei Yang, Beijing (CN); Yuanhao Sun, Beijing (CN); Yuanda Lu, Beijing (CN); Xueqiao Li, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 639 days.

(21) Appl. No.: 17/920,017

(22) PCT Filed: Oct. 28, 2021

(86) PCT No.: PCT/CN2021/127169
§ 371 (c)(1),
(2) Date: Oct. 19, 2022

(87) PCT Pub. No.: WO2023/070464
PCT Pub. Date: May 4, 2023

(65) Prior Publication Data
US 2024/0213422 A1 Jun. 27, 2024

(51) Int. Cl.
*H10H 20/856* (2025.01)
*H10H 20/01* (2025.01)
(Continued)

(52) U.S. Cl.
CPC ........ *H10H 20/856* (2025.01); *H10H 20/854* (2025.01); *H10H 20/0362* (2025.01); *H10H 20/0363* (2025.01); *H10H 20/857* (2025.01)

(58) Field of Classification Search
CPC .............. H10H 20/856; H10H 20/854; H10H 20/0362; H10H 20/0363; H10H 20/857;
(Continued)

(56) References Cited

U.S. PATENT DOCUMENTS

2002/0028045 A1* 3/2002 Yoshimura .......... H01L 23/5389
385/39
2002/0056837 A1* 5/2002 Yamanaka ......... H10D 30/0323
257/E29.295
(Continued)

FOREIGN PATENT DOCUMENTS

CN 108172674 A 6/2018
CN 109346564 A 2/2019
(Continued)

OTHER PUBLICATIONS

Yang, Tien-Syh, Ching-Bin Shiu, and Ming-Show Wong. "Structure and hydrophilicity of titanium oxide films prepared by electron beam evaporation." Surface Science 548.1-3 (2004): 75-82. (Year: 2004).*

*Primary Examiner* — Norman D Richards
*Assistant Examiner* — Ethan Edward Cutler
(74) *Attorney, Agent, or Firm* — Ling Wu; Stephen Yang; Ling and Yang Intellectual Property

(57) ABSTRACT

A light emitting device and a preparation method therefor, and a light emitting substrate and a preparation method therefor are provided. The light emitting device includes an underlay substrate, a light emitting functional layer disposed on the underlay substrate, and a reflective layer disposed on the underlay substrate and covering at least part of the light emitting functional layer, the reflective layer includes a first material layer and a second material layer, the first material layer and the second material layer are stacked along a (Continued)

n second material layers + n-1 third material layers thickness direction of the underlay substrate, the first material layer includes an atomic crystal material, the first material layer is at one side of the second material layer away from the underlay substrate, and a surface of the first material layer away from the second material layer is formed as a surface of the reflective layer away from the underlay substrate.

16 Claims, 3 Drawing Sheets

(51) Int. Cl.
*H10H 20/854* (2025.01)
*H10H 20/857* (2025.01)

(58) Field of Classification Search
CPC .... H10H 20/034; H10H 20/80; H10H 20/814; H10H 20/835; H10H 20/841; H10H 29/10
See application file for complete search history.

(56) References Cited

U.S. PATENT DOCUMENTS

| | | | | |
|---|---|---|---|---|
| 2010/0084670 A1* | 4/2010 | Cheng | ................. | H10H 20/814 |
| | | | | 257/E33.068 |
| 2019/0384110 A1* | 12/2019 | Tanaka | .................. | H10K 59/35 |
| 2020/0083405 A1 | 3/2020 | Choi et al. | | |

FOREIGN PATENT DOCUMENTS

| | | | | | |
|---|---|---|---|---|---|
| CN | 109346564 B | * | 3/2020 | ........... | H01L 33/005 |
| CN | 111081832 A | * | 4/2020 | ......... | H01L 33/0075 |
| CN | 112289915 A | | 1/2021 | | |
| CN | 113410364 A | | 9/2021 | | |
| CN | 113451476 A | | 9/2021 | | |
| TW | 201015747 A | | 4/2010 | | |

* cited by examiner

LIGHT EMITTING DEVICE HAVING A REFLECTIVE LAYER COMPRISING ATOMIC CRYSTAL MATERIAL AND PREPARATION METHOD THEREOF, LIGHT EMITTING SUBSTRATE AND PREPARATION METHOD THEREOF

CROSS-REFERENCE TO RELATED APPLICATION

The present application is a U.S. National Phase Entry of International Application PCT/CN2021/127169 having an international filing date of Oct. 28, 2021, and the contents disclosed in the above-mentioned application are hereby incorporated as a part of this application.

TECHNICAL FIELD

Embodiments of the present disclosure relate to, but are not limited to, the field of display technology, and specifically to a light emitting device, a method for preparing the light emitting device, a light emitting substrate, and a method for preparing the light emitting substrate.

BACKGROUND

A Light Emitting Diode (LED) is a kind of semiconductor device which can emit light. By employing different semiconductor materials and structures, since an LED chip have advantages such as simple structure, small volume, energy saving, high efficiency, long service life, and clear light, in recent years, they have gradually replaced conventional lamps and lanterns such as incandescent lamps and fluorescent lamps, etc., and are becoming mainstream products in a new generation lighting market, and are also widely applied in photoelectric systems.

At present, a mainstream of a Mini-LED display industry in the market is PCB-based products with conventional passive drive mode (PM). This drive mode achieves different brightness of modules by adjusting a duty cycle. An instantaneous brightness of a module is relatively high, and a relative current used is large, which is generally at a milliampere level. At this time, optical and electrical properties of an LED chip are relatively stable.

In some Mini-LED glass-based products based on an active drive mode (AM), adjusting of brightness is achieved by adjusting a current used. The LED of a whole module will keep a state of being always light up, so the current used of the module is relatively low, generally at a microampere level. Compared with PM drive, it is one to three orders of magnitude smaller. When the LED is used under a small current at the microampere level, a density of the current is very small, which will lead to many problems: for example, difficult calibration caused by large brightness and chrominance differences between LEDs under a micro-current; since an order of magnitude of a bad leakage of the LED chip itself is equivalent to that of a current used under a low gray scale of the module, part of LEDs will not light up under the low gray scale, resulting in problems such as uneven lighting up of the module.

SUMMARY

The following is a summary of subject matter described herein in detail. The summary is not intended to limit the protection scope of claims.

In a first aspect, an embodiment of the present disclosure provides a light emitting device, including an underlay substrate, a light emitting functional layer disposed on the underlay substrate, and a reflective layer which is disposed on the underlay substrate and covers at least part of the light emitting functional layer, wherein the reflective layer includes a first material layer and a second material layer, the first material layer and the second material layer are stacked along a thickness direction of the underlay substrate, the first material layer includes an atomic crystal material, the first material layer is located at one side of the second material layer away from the underlay substrate, and a surface of the first material layer away from the second material layer is formed as a surface of the reflective layer away from the underlay substrate.

In an exemplary embodiment, the first material layer includes at least one of aluminum oxide, silicon dioxide, and aluminum nitride.

In an exemplary embodiment, the reflective layer further includes multiple third material layers, a plurality of the second material layers are provided, and the third material layers and the second material layers are alternately stacked in sequence along the thickness direction of the underlay substrate.

In an exemplary embodiment, the third material layers and the first material layer include a same atomic crystal material, and one of the second material layers is disposed on a surface of the first material layer facing the underlay substrate.

In an exemplary embodiment, an optical thickness of each of the first material layer, a second material layer, and a third material layer is a quarter of a central reflection wavelength of the reflective layer.

In an exemplary embodiment, the second material layer includes a titanium dioxide material.

In an exemplary embodiment, the light emitting functional layer includes a first semiconductor layer, a quantum well layer, a second semiconductor layer, and a conductive layer disposed in sequence on the underlay substrate, wherein the first semiconductor layer includes a first portion and a second portion, a vertical projection of the first portion on the underlay substrate overlaps with a vertical projection of the quantum well layer and the second semiconductor layer on the underlay substrate; a vertical projection of the second portion on the underlay substrate does not overlap with the vertical projection of the quantum well layer and the second semiconductor layer on the underlay substrate.

In an exemplary embodiment, a first electrode and a second electrode are further included, wherein the first electrode is disposed on the second portion of the first semiconductor layer, and the second electrode is disposed on the second semiconductor layer.

In an exemplary embodiment, a vertical projection of the reflective layer on the underlay substrate overlaps with a vertical projection of the first electrode and the second electrode on the underlay substrate.

In an exemplary embodiment, a first pad and a second pad are further included, wherein the first pad and the second pad are both disposed at one side of the reflective layer away from the underlay substrate, a first via hole and a second via hole are formed in the reflective layer, the first pad is connected to the first electrode through the first via hole, and the second pad is connected to the second electrode through the second via hole.

In an exemplary embodiment, in a first direction of the light emitting device, the light emitting device has a first length, the first length being L, the first pad and the second pad are arranged at intervals in the first direction, a distance between an edge of the first pad close to the second pad and an edge of the second pad close to the first pad is D, and the first length L and the distance D satisfy a relational formula: 33% L≤D≤66% L.

In an exemplary embodiment, an edge of the first pad away from the second pad is flush with an edge of the light emitting functional layer at one side, and an edge of the second pad away from the first pad is flush with an edge of the light emitting functional layer at another side.

In an exemplary embodiment, the light emitting device is a light emitting diode.

In a second aspect, an embodiment of the present disclosure also provides a light emitting substrate, including a drive substrate, and the aforementioned light emitting devices arranged in an array on the drive substrate.

In a third aspect, an embodiment of the present disclosure further provides a method for preparing a light emitting device, including: forming a light emitting functional layer on an underlay substrate; and forming a reflective layer on the underlay substrate; the reflective layer covers at least part of the light emitting functional layer; wherein the reflective layer at least includes a first material layer, the first material layer includes an atomic crystal material, the reflective layer further includes a second material layer, the first material layer and the second material layer are stacked along a thickness direction of the underlay substrate, the first material layer is located at one side of the second material layer away from the underlay substrate, and a surface of the first material layer away from the second material layer is formed as a surface of the reflective layer away from the underlay substrate.

In an exemplary embodiment, forming a reflective layer on the underlay substrate includes: forming the second material layer of the reflective layer by an atomic layer deposition process.

In an exemplary embodiment, the second material layer includes a titanium dioxide material, and forming a reflective layer on the underlay substrate includes: forming the second material layer of the reflective layer by an electron beam evaporation process, wherein a partial pressure of oxygen is $1 \times 10^{-2}$ to $5 \times 10^{-2}$ during deposition of the second material layer.

In a fourth aspect, an embodiment of the present disclosure further provides a method for preparing a light emitting substrate, including: forming a light emitting device, wherein the light emitting device includes a reflective layer; forming a first pad and a second pad on the reflective layer of the light emitting device; welding the first pad and the second pad to a drive substrate respectively through flux; and removing the flux remaining on the reflective layer.

In an exemplary embodiment, removing the flux remaining on the reflective layer includes: removing the flux remaining on the reflective layer at a temperature of 60-180° C.; or, cleaning and removing the flux remaining on the reflective layer.

Other aspects may be understood upon reading and understanding the drawings and the detailed description.

DETAILED DESCRIPTION

Figure 1:
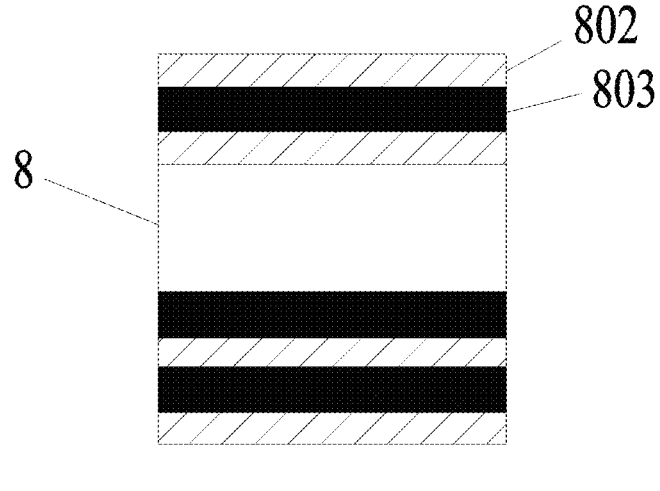
FIG. 1 is a schematic diagram of a structure of a reflective layer in a light emitting device in the related art.

The embodiments of the present disclosure will be described in detail below with reference to the drawings. It is to be noted that implementation modes may be implemented in multiple different forms. Those of ordinary skills in the art may readily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, "about" refers to that a boundary is defined not so strictly and numerical values within process and measurement error ranges are allowed.

A manufacturing size of a Light Emitting Diode (LED) has a trend of being smaller and smaller, for example, a Micro Light Emitting Diode (Micro LED) or a Mini Light Emitting Diode (Mini LED), and a Mini LED/Micro LED display screen may achieve large-size display by splicing, so they have a relatively good market prospect.

It is found according to a research of the inventor of the present disclosure, for a conventional mini/micro LED backlight or display product, a mainstream at present is a PCB substrate and a PM drive mode. Because of a problem of flatness of the substrate, it is impossible to achieve a very small pitch. The PM drive mode adjusts a brightness of a module by adjusting a duty cycle, so an instantaneous brightness is relatively high, a current used by a chip of a light emitting device is relatively large, a micro-leakage of the light emitting device has little influence under this current, and a photoelectric parameter is relatively stable. However, with increasing requirements for a display effect, PPI, and health consideration subsequently, an active (AM) drive mode based on a glass substrate is a development direction for future products. The glass substrate may achieve a smaller pitch and a larger PPI, while AM drive may ensure a better display effect. The AM drive achieves adjustment of brightness by controlling magnitude of a current of a single pixel, so a working state of the module is: LED keeps always light up under a low current (a micro-ampere level), so the instantaneous brightness is low, it does not flicker, and it is more eye-protecting. However, under a very small current, the micro-leakage of the LED will cause the following problems 1 to 3.

1. The LED itself has a defect. When a current passes through an LED chip, some leakage channels caused by the defect will open. At a relatively small current, a quantity of electrons flowing in a unit time is relatively small, and there will be a situation that all electrons pass through the leakage channels. At this time, there are no carriers available for radiation recombination, and the chip does not emit light. An appearance shows that under a low current, some chips do not light up, and a whole module shows uneven lighting up.

2. Due to the leakage channels caused by the defect existing in the LED itself, the LED chip with a relatively large leakage will be darker than a normal chip at a slightly high gray scale at which lighting up may occur, and show serious uneven brightness and darkness at a low gray scale, which will even affect a performance at full gray scales, seriously affecting the display effect.

3. In order to avoid the problem of uneven lighting up at the low gray scale existing at present, one measure currently taken for driving is to raise a basic current used at the low gray scale and reduce a duty cycle by PWM, but this makes the AM drive lose its original advantage of being eye-protecting and will compress a quantity of bits of a drive IC, which leads to incapability of correcting at a relatively low gray scale.

FIG. 1 is a schematic diagram of a structure of a reflective layer in a light emitting device in the related art. The light emitting device generally includes an underlay substrate, a light emitting functional layer disposed on the underlay substrate, and a reflective layer disposed on the underlay substrate and covering the light emitting functional layer. As shown in FIG. 1, the reflective layer 8 generally includes multiple material layers 802 and multiple material layers 803 which are stacked. The multiple material layers 802 and the multiple material layers 803 are alternately disposed. A surface of the reflective layer 8 away from the underlay substrate is a surface of a material layer 802 away from a material layer 803, that is, a surface exposed to the light emitting device is the surface of the material layer 802 away from the material layer 803. Herein, the material layer 802 is made of an ionic crystal material, and the material layer 803 is made of an atomic crystal material.

Figure 2:
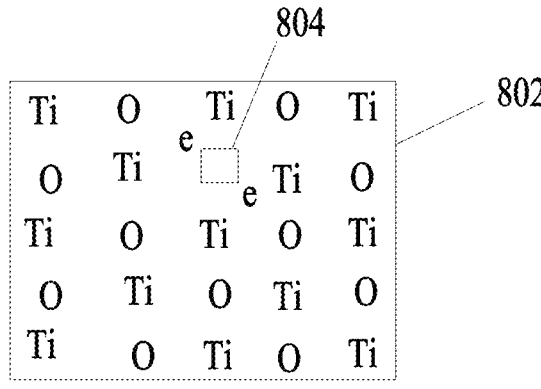
FIG. 2 is a schematic diagram of a first material layer in a light emitting device in the related art.

FIG. 2 is a schematic diagram of a material layer 802 in a light emitting device in the related art. As shown in FIG. 2, an example is taken in which the material layer 802 is a titanium dioxide material film layer and the material layer 803 is a silicon dioxide material film layer. Titanium dioxide is an ionic crystal. The titanium dioxide material film layer is prone to non-stoichiometric point defects 804, which are generally oxygen ion vacancy defects on a surface, or partially titanium ion vacancy defects located in a body position. Oxygen ion vacancy defects on a surface of the titanium dioxide material film layer mainly affect a chemical conductive property of the titanium dioxide material film layer. After oxygen ions on the surface of the titanium dioxide material film layer become oxygen molecules and escape, quasi-free electrons $2e$ are generated. In order to maintain electrical neutrality, the quasi-free electrons $2e$ convert part of $Ti^{4+}$ into $Ti^{3+}$.

Figure 3:
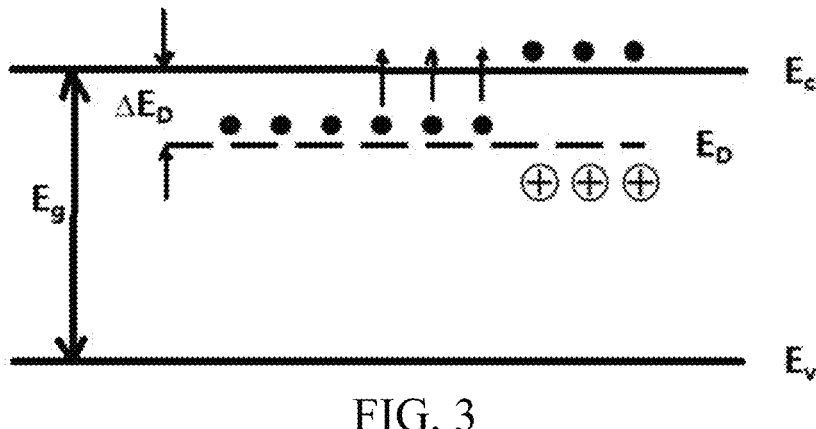
FIG. 3 is a schematic diagram of a donor energy level of a first material layer in a light emitting device in the related art.

FIG. 3 is a schematic diagram of a donor energy level of a second material layer in a light emitting device in the related art. As shown in FIG. 3, an oxygen ion is a negative ion, a vacancy is generated as a donor impurity, and the donor energy level is shown in FIG. 3, wherein, $E_g$ is a band gap width, $E_D$ is the donor energy level, $E_c$ is a conduction band energy level, $\Delta E_D$ is a difference between the donor energy level and the conduction band energy level, and $E_v$ is a valence band energy level. When the donor impurity ionizes, after an electron obtains $\Delta E_D$, quasi-free electrons $2e$ bound on a donor transitions from the donor energy level to a bottom of a conduction band, and a quantity of electrons in the conduction band increases. Because electric conduction mainly depends on electrons in the conduction band, the second material layer at this time is an n-type semiconductor.

Through experiments, the inventor found that slightly reducing a content of oxygen ions in the second material layer will have a special influence on a conductivity of the second material layer. A conductivity of titanium dioxide ($TiO_2$) according to a chemical composition is less than 10-10 s/cm, while a conductivity of $TiO_{1.9995}$ is only 10-1 s/cm. Therefore, the above defects of the second material layer will lead to a micro-leakage of the light emitting device, which affects performance of the light emitting device.

Figure 4:
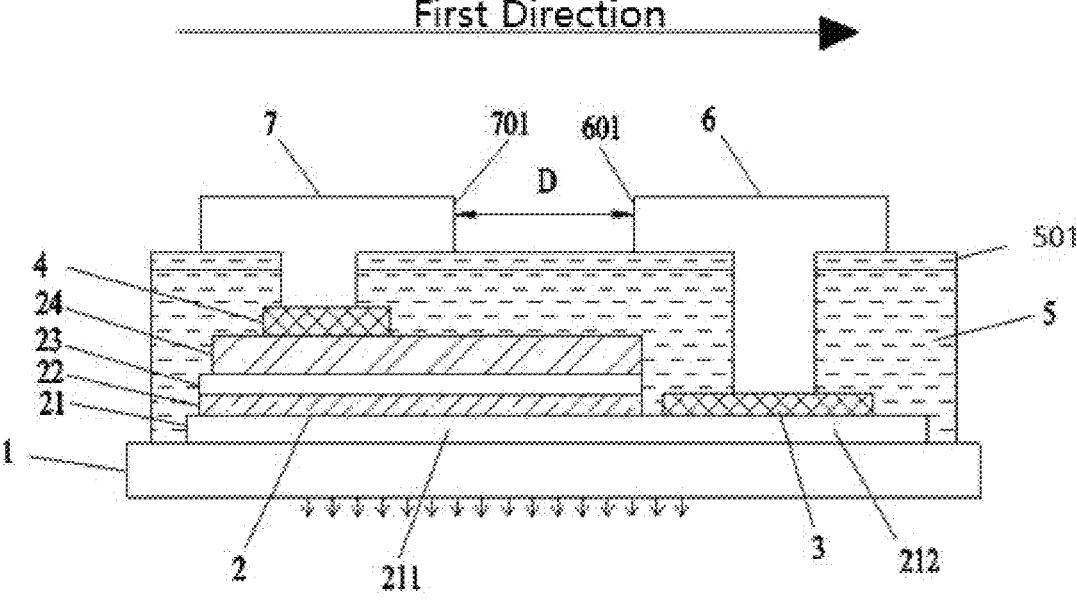
FIG. 4 is a schematic diagram of a structure of a light emitting device according to an embodiment of the present disclosure.

FIG. 4 is a schematic diagram of a structure of a light emitting device according to an embodiment of the present disclosure. As shown in FIG. 4, the embodiment of the present disclosure provides a light emitting device, wherein a main structure of the light emitting device includes an underlay substrate 1, a light emitting functional layer 2 disposed on the underlay substrate 1, a first electrode 3 and a second electrode 4 disposed at one side of the light emitting functional layer 2 away from the underlay substrate 1, and a reflective layer 5 disposed on the underlay substrate 1 and covering at least part of the light emitting functional layer 2. Herein, the underlay substrate 1, as a substrate of the light emitting device, may be a glass substrate. The first electrode 3 and the second electrode 4 are respectively taken as contact electrodes of the light emitting functional layer 2, wherein the light emitting functional layer 2 is used for emitting light under a role of voltages of the first electrode 3 and the second electrode 4. The reflective layer 5 is used for reflecting part of light emitted by the light emitting functional layer 2 to increase a light emitting efficiency of the light emitting device. Herein, the light emitting device may be a light emitting diode.

In an exemplary embodiment, the reflective layer 5 at least includes a first material layer 501 and a second material layer 502, wherein the first material layer 501 and the second material layer 502 are stacked along a thickness direction of the underlay substrate 1. The first material layer 501 includes an atomic crystal material, the first material layer 501 is located at one side of the second material layer 502 away from the underlay substrate 1, and a surface of the first material layer 501 away from the second material layer 502 is formed as a surface of the reflective layer 5 away from the underlay substrate 1. An atomic crystal material is a crystal material with a spatial three-dimensional network structure formed by covalent bonds between adjacent atoms. The atomic crystal material has good thermal stability, has few defects, is not easy to dissolve in any solvent, has very stable chemical properties, and is a poor conductor of electricity. The atomic crystal material can be stable at a high temperature, and ensure a stable defect concentration in a reduction atmosphere. The light emitting device of the embodiment of the present disclosure solves a problem of an electric leakage caused by crystal defects in the reflective layer 5 by forming the surface of the first material layer as the surface of the reflective layer and utilizing the first material layer to adopting the atomic crystal material, improves differences of brightness and chrominance of the light emitting device under a low current, and solves a problem of uneven lighting up of the light emitting device under low gray.

In an exemplary embodiment, the first material layer 501 may include a variety of atomic crystal materials. For example, the first material layer 501 may include at least one of aluminium oxide, silicon dioxide, and aluminum nitride.

Figure 5:
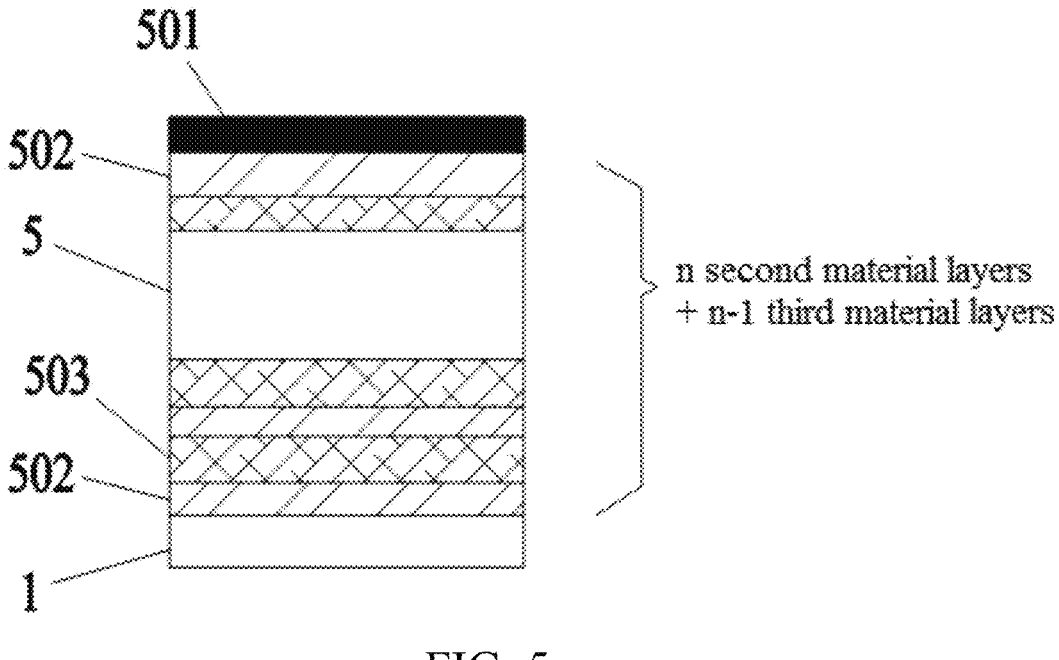
FIG. 5 is a first schematic diagram of a structure of a reflective layer in a light emitting device according to an embodiment of the present disclosure.

FIG. 5 is a first schematic diagram of a structure of a reflective layer in a light emitting device according to an embodiment of the present disclosure. As shown in FIG. 5, the reflective layer 5 further includes multiple third material layers 503, wherein a third material layer 503 includes the atomic crystal material. A quantity of second material layers 502 is also multiple, and the third material layers 503 and the second material layers 502 are alternately stacked in sequence along the thickness direction of the underlay substrate 1.

In an exemplary embodiment, as shown in FIG. 5, quantities of the second material layers 502 and the third material layers 503 may be different. Specifically, the reflective layer 5 includes n second material layers 502, n–1 third material layers 503, and one first material layer 501 which are stacked, wherein the n second material layers 502 and the n–1 third material layers 503 are alternately disposed, i.e. a first second material layer 502 is disposed on the underlay substrate 1, a first third material layer 503 is disposed on the first second material layer 502, a second one of the second material layers 502 is disposed on the first third material layer 503, a second third material layer 503 is disposed on the second one of the second material layers 502, and so on. The first material layer 501 is disposed at one side of an n-th second material layer 502 away from the underlay substrate 1. A surface of the first material layer 501 away from the second material layer 502 is formed as a surface of the reflective layer 5 away from the underlay substrate 1. The first material layer 501 includes an atomic crystal material, and the atomic crystal material can solve a leakage problem of the reflective layer 5 caused by crystal defects.

In some embodiments, quantities of the second material layers 502 and the third material layers 503 may be the same. Specifically, the reflective layer includes n second material layers, n third material layers, and one first material layer which are stacked, wherein n is an integer. The n second material layers and the n third material layers are alternately disposed, i.e. a first second material layer is disposed on the underlay substrate, a first third material layer is disposed on the first second material layer, a second one of the second material layers is disposed on the first third material layer, a second third material layer is disposed on the second one of the second material layers, and so on. The first material layer is disposed at one side of an n-th third material layer away from the underlay substrate. A surface of the first material layer away from the second material layers is formed as a surface of the reflective layer away from the underlay substrate. The first material layer includes the atomic crystal material, and the atomic crystal material can solve a leakage problem of the reflective layer caused by crystal defects.

Figure 6:
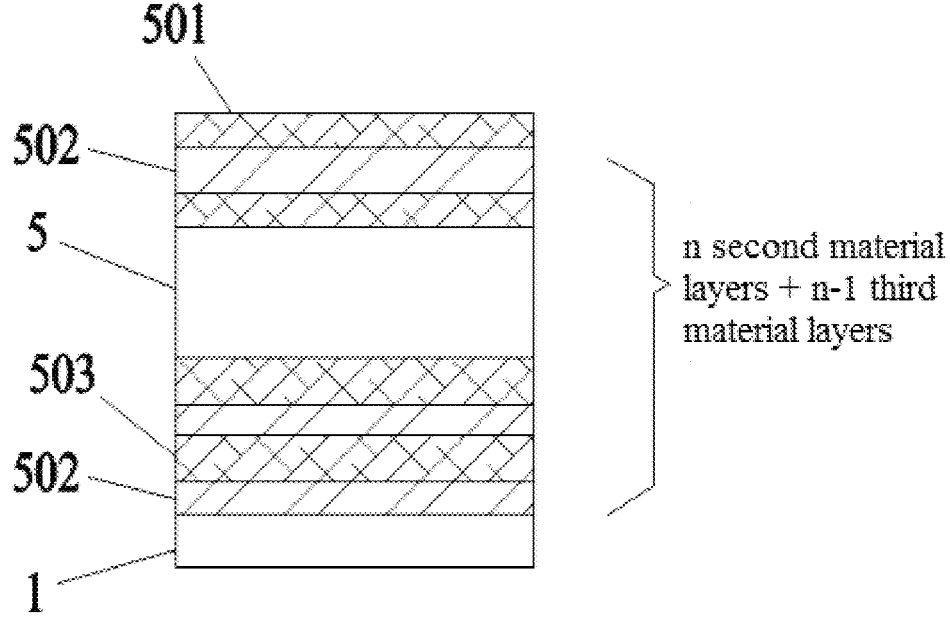
FIG. 6 is a second schematic diagram of a structure of a reflective layer in a light emitting device according to an embodiment of the present disclosure.

FIG. 6 is a second schematic diagram of a structure of a reflective layer in a light emitting device according to an embodiment of the present disclosure. As shown in FIG. 6, the third material layers 503 and the first material layer 501 include the same atomic crystal material, and one of the second material layers 502 is disposed on a surface of the first material layer 501 facing the underlay substrate 1. Specifically, the reflective layer 5 includes n second material layers 502, n–1 third material layers 503, and one first material layer 501 which are stacked, wherein the n second material layers 502 and the n–1 third material layers 503 are alternately disposed, i.e. a first second material layer 502 is disposed on the underlay substrate 1, a first third material layer 503 is disposed on the first second material layer 502, a second one of the second material layers 502 is disposed on the first third material layer 503, a second third material layer 503 is disposed on the second one of the second material layer 502, and so on. The first material layer 501 is disposed at one side of an n-th second material layer 502 away from the underlay substrate 1. A surface of the first material layer 501 away from the second material layer 502 is formed as a surface of the reflective layer 5 away from the underlay substrate 1. The third material layers 503 and the first material layer 501 include the same atomic crystal material, and the atomic crystal material can solve a leakage problem of the reflective layer 5 caused by crystal defects. For example, the first material layer 501 and the third material layers 503 each include a silicon dioxide material, and the second material layer 502 includes a titanium dioxide material. Silicon dioxide is an atomic crystal, a spatial three-dimensional network structure is formed by covalent bonds of adjacent silicon atoms and oxygen atoms in the silicon dioxide, and a structure of the silicon dioxide is relatively stable. Compared with ionic bonded titanium dioxide, there are fewer defects, and a resulting leakage current is much smaller.

After encapsulating and simulating mini light emitting device chips with sizes of 0306 and 0408, respectively, a reverse leakage current (IR) is tested, wherein the light emitting device chip with a size of 0306 and the mini light emitting device chip with a size of 0408 each include the light emitting device of the embodiment of the present disclosure shown in FIG. 5 and the light emitting device in the related art shown in FIG. 1. A test result is shown in Table 1. According to Table 1, it can be seen that a reverse leakage current of the light emitting device of the embodiment of the present disclosure and a reverse leakage current of the light emitting device in the related art are obviously different. The light emitting device in the related art shown in FIG. 1 has a large leakage current, which correspondingly shows that it is not bright under a low current on the module.

TABLE 1

| | | | IR (uA) Test voltage: −12 V | | |
| Chips | Descriptions of DBR | Number of chips tested | Min | Avg | Max |
|---|---|---|---|---|---|
| 0408 | SiO2 at an outermost layer | 100 | 0.0002 | 0.0024 | 0.0195 |
| | TiO2 at an outermost layer | 100 | 0.0008 | 0.0298 | 0.0975 |
| 0306 | SiO2 at an outermost layer | 480 | 0.0001 | 0.0009 | 0.0222 |
| | TiO2 at an outermost layer | 480 | 0.0003 | 0.0252 | 0.1689 |

In addition, in a simplified model of the light emitting device chip, in a situation of a same electrical measurement interval, a leakage of a sample with an outermost film layer of $SiO_2$ of the reflective layer is smaller than a leakage of a sample with an outermost film layer of $TiO_2$ of the reflective layer. Herein, the outermost film layer of the reflective layer refers to a film layer of the reflective layer farthest away from the underlay substrate along the thickness direction of the underlay substrate. For example, in the light emitting device of the embodiment of the present disclosure shown in FIG. 5, the first material layer is the outermost film layer of the reflective layer.

At 1 bit, brighting up of a light emitting device chip with the outermost film layer of $TiO_2$ of the reflective layer is uneven, while an effect of brighting up of a light emitting device chip with the outermost film layer of $SiO_2$ of the reflective layer is better. In addition, the light emitting device chip with the outermost film layer of $SiO_2$ of the reflective layer is better than the light emitting device chip with the outermost film layer of $TiO_2$ of the reflective layer in uniformity of a brightness change at middle and high gray scales. For example, a brightness difference of the light emitting device chip with the outermost film layer of $TiO_2$ of the reflective layer is 11.8% at a 255 gray scale, and the brightness difference reaches 24% at a 50 gray scale, assuming an amplification trend, which will cause a great difficulty in system calibration, and a final display effect of the module cannot be ensured. However, in the light emitting device chip with the outermost film layer of $SiO_2$ of the reflective layer, brightness differences at four higher gray scales are each within 1%, which shows that uniformity between modules at middle and high gray scales is better.

In an exemplary embodiment, an optical thickness of each of the first material layer 501, the second material layers 502, and the third material layers 503 is a quarter of a central reflection wavelength of the reflective layer 5 to increase a reflection efficiency of light.

In an exemplary embodiment, as shown in FIG. 4, the light emitting functional layer 2 includes a first semiconductor layer 21, a quantum well layer 22, a second semiconductor layer 23, and a conductive layer 24 which are sequentially disposed on the underlay substrate 1. Herein, the first semiconductor layer 21 serving as an electron injection layer is disposed on the underlay substrate 1, the quantum well layer 22 serving as a light emitting layer is disposed on the first semiconductor layer 21, and the second semiconductor layer 23 serving as a hole injection layer is disposed on the quantum well layer 22 for providing carrier holes, and the conductive layer 24 is disposed on the second semiconductor layer 23.

In an exemplary embodiment, as shown in FIG. 4, the first semiconductor layer 21 includes a first portion 211 and a second portion 212. A vertical projection of the first portion 211 on the underlay substrate 1 overlaps with a vertical projection of the quantum well layer 22 and the second semiconductor layer 23 on the underlay substrate 1, and a vertical projection of the second portion 212 on the underlay substrate 1 does not overlap with the vertical projection of the quantum well layer 22 and the second semiconductor layer 23 on the underlay substrate 1, such that a surface of the second semiconductor layer 23 is formed with a high step surface, and a surface of the second portion 212 of the first semiconductor layer 21 is formed with a bottom step surface. The first electrode 3 is disposed on the bottom step surface of the second portion 212 of the first semiconductor layer 21, and the second electrode 4 is disposed on the high step surface of the second semiconductor layer 23.

In an exemplary embodiment, as shown in FIG. 4, the reflective layer 5 covers the light emitting functional layer 2, the first electrode 3, and the second electrode 4, i.e. a vertical projection of the reflective layer 5 on the underlay substrate 1 overlaps with a vertical projection of the light emitting functional layer 2, the first electrode 3, and the second electrode 4 on the underlay substrate 1.

In an exemplary embodiment, as shown in FIG. 4, a main body structure of the light emitting device further includes a first pad 6 and a second pad 7, wherein the first pad 6 and the second pad 7 are both disposed on the surface of the reflective layer 5 away from the underlay substrate 1. A first via hole and a second via hole are formed in the reflective layer 5, wherein the first via hole extends to the first electrode 3, and the second via hole extends to the second electrode 4. The first pad 6 is connected to the first electrode 3 through the first via hole, and the second pad 7 is connected to the second electrode 4 through the second via hole.

In an exemplary embodiment, as shown in FIG. 4, in a first direction of the light emitting device, the light emitting device has a first length, wherein the first length is L, and the first length is a length from an edge of the underlay substrate 1 at one side to an edge of the underlay substrate 1 at another side in the first direction in the light emitting device. First pads 6 and second pads 7 are arranged at intervals in the first direction. In the first direction of the light emitting device, a distance between an edge of the first pad 6 close to the second pad 7 and an edge of the second pad 7 close to the first pad 6 is D, and the first length L and the distance D between the edge of the first pad 6 close to the second pad 7 and the edge of the second pad 7 close to the first pad 6 satisfy a relational formula: 33% $L \le D \le 66\%$ L. In the related art, a distance D between the edge of the first pad 6 close to the second pad 7 and the edge of the second pad 7 close to the first pad 6 is 26% to 32% of the first length of the light emitting device. The light emitting device of the embodiment of the present disclosure reduces a leakage current of the light emitting device by increasing the distance D between the edge of the first pad 6 and the edge of the second pad 7. In a simplified model of the light emitting device, different distances L between the edge of the first pad 6 and the edge of the second pad 7 exhibit different leakage levels, and the larger the distance D between the edge of the first pad 6 and the edge of the second pad 7, the smaller the leakage current under a same voltage. A film layer between the first pad 6 and the second pad 7 may be understood as a resistance, and the distance D between the edge of the first pad 6 and the edge of the second pad 7 is taken as a length of the resistance. According to a resistance formula: R=ρL/S, the resistance is proportional to the length of the resistance, and the greater the distance D between the edge of the first pad 6 and the edge of the second pad 7, the greater the resistance and the smaller the leakage current. At the same time, the distance D between the edge of the first pad 6 and the edge of the second pad 7 cannot be too large, otherwise a poor thrust effect will be caused.

In some embodiments, an edge of the first pad away from the second pad is flush with an edge of the light emitting functional layer at one side, and an edge of the second pad away from the first pad is flush with an edge of the light emitting functional layer at another side, thereby increasing the distance D between the edge of the first pad close to the second pad and the edge of the second pad close to the first pad, and reducing the leakage current of the light emitting device.

In a practical application, the underlay substrate 1 of the light emitting device is placed upward, and the first pad 6 and the second pad 7 located at one side of the light emitting device away from the underlay substrate 1 are welded to positive and negative electrodes of a drive substrate, respectively. The positive and negative electrodes on the drive substrate are turned on, a current is injected to the light emitting device, and the first semiconductor layer 21 and the second semiconductor layer 23 are driven to inject electrons and holes into the quantum well layer 22 respectively for composite light emission, and light emitted from the quantum well layer 22 is emitted out through the underlay substrate 1.

An embodiment of the present disclosure further provides a light emitting substrate, including a drive substrate and any of the aforementioned light emitting devices arranged in an array on the drive substrate.

An embodiment of the present disclosure further provides a method for preparing a light emitting device, including: forming a light emitting functional layer on an underlay substrate; and forming a reflective layer on the underlay substrate; the reflective layer covers at least part of the light emitting functional layer; wherein the reflective layer at least includes a first material layer, the first material layer includes an atomic crystal material, the reflective layer further includes a second material layer, the first material layer and the second material layer are stacked along a thickness direction of the underlay substrate, the first material layer is located at one side of the second material layer away from the underlay substrate, and a surface of the first material layer away from the second material layer is formed as a surface of the reflective layer away from the underlay substrate.

In an exemplary embodiment, forming the reflective layer on the underlay substrate includes: forming the second material layer of the reflective layer by an atomic layer deposition process. Herein, the second material layer may include a titanium dioxide material.

Forming the second material layer by an atomic layer deposition process (ALD) can reduce defects of the second material layer and improve a quality of crystals. For example, taking that the second material layer may include the titanium dioxide material as an example, titanium dioxide materials usually have oxygen defects, and defects will be produced by electron beam evaporation, especially a high temperature in a process will significantly affect a concentration of oxygen ion defects. In a high temperature environment, oxygen ions in crystal lattice will escape into the atmosphere, resulting in that oxygen vacancies appear in the crystal. Controlling the oxygen vacancies within a certain level may effectively control a micro-leakage situation of the light emitting device. The atomic layer deposition process (ALD) is a method that may plate substances layer by layer on a surface of a base substrate in a form of monatomic films. A deposited layer has very uniform thickness and excellent consistency, and a quality of the deposited crystal is relatively good, so it may effectively reduce a density of oxygen defects and thus improve a leakage situation of the light emitting device.

In an exemplary embodiment, the second material layer may include a titanium dioxide material, and forming the reflective layer on the underlay substrate includes: forming the second material layer of the reflective layer by an electron beam evaporation process, wherein a partial pressure of oxygen is $1 \times 10^{-2}$ to $5 \times 10^{-2}$ in a process of depositing the second material layer.

In an exemplary embodiment, a partial pressure of oxygen may be $2*10^{-2}$ pa. The partial pressure of oxygen being too small will lead to an increase of O vacancies, the partial pressure of oxygen being too large will lead to a loose film layer, a size of an optimal partial pressure needs to match with other process conditions, so an optimal partial pressure condition needs to be determined according to an actual situation.

An example is taken in which the second material layer may include the titanium dioxide material. When the second material layer is formed by the electron beam evaporation process, the partial pressure of oxygen in a process of depositing the second material layer is increased. In a process of depositing a thin film of the second material layer, appearing of oxygen defects cannot be avoided. An equilibrium constant of a total reaction is as follows:

$$K = \frac{[V_{\ddot{O}}][P_{O_2}]^{\frac{1}{2}}[e']^2}{[O_O]},$$

wherein, $V_{\ddot{O}}$ is a O vacancy, $P_{O_2}$ is a concentration of oxygen in an environment, so we may get $$V_{\ddot{O}} \propto P_{O_2}^{-\frac{1}{6}}.$$

The formula is changed into a form $$V_O^{-6} \propto \frac{1}{P_{O_2}},$$

that is, in a titanium dioxide crystal, a $6^{th}$ power of a vacancy concentration of oxygen is inversely proportional to a pressure of oxygen in an ambient atmosphere, so it may be seen that a non-stoichiometry in titanium dioxide, that is, a concentration of oxygen defects, is quite sensitive to a concentration of oxygen in the ambient atmosphere. Therefore, increasing a partial pressure of oxygen in a manufacturing process may effectively reduce oxygen defects in the titanium dioxide crystal and thus improve the leakage of the light emitting device.

An embodiment of the present disclosure further provides a method for preparing a light emitting substrate, including: forming a light emitting device by using the method for preparing the aforementioned light emitting device; forming a first pad and a second pad on the reflective layer of the light emitting device; welding the first pad and the second pad to a drive substrate respectively through flux; and removing the flux remaining on the reflective layer.

In an exemplary embodiment, removing the flux remaining on the reflective layer includes: removing the flux remaining on the reflective layer at a temperature of 60-180° C.; or, cleaning and removing the flux remaining on the reflective layer.

The inventor of the present disclosure has found that the first pad and the second pad are welded to the drive substrate by the flux, and some substances, mainly some carboxylic acid, as active agents will be in the flux. The flux will cause defects on a surface of the reflective layer close to the drive substrate.

The flux is taken as an organic carboxylic acid, in the light emit device in the related art:

a surface of the reflective layer close to the drive substrate is an ionic crystal material. The ionic crystal material being $TiO_2$ is taken as an example. O in the organic carboxylic acid and oxygen vacancies on a $TiO_2$ surface may be adsorbed on Ti atoms with pentacoordination on a surface, that is, to fill O vacancies on the surface. H in the organic carboxylic acid may form hydrogen bonds with O on the $TiO_2$ surface, so $TiO_2$ has relatively strong adsorption for water and part of organics. Acids adsorbed on the surface may induce O vacancies on a subsurface to migrate to the surface. Experimental data show that an energy barrier of O vacancies from the subsurface to the surface is 1.01 eV without adsorption on an anatase surface, but it becomes 0.12 eV with formic acid monodentate adsorption. Therefore, when there are O defects on the surface, an introduction of organic acids will further lead to a concentration of O defects in $TiO_2$, which will further increase a conductivity of $TiO_2$.

Therefore, reducing an influence of the flux on a leakage level of the light emitting device may effectively solve a problem of lighting up under a low gray scale with AM drive.

After the first pad and the second pad are welded to the drive substrate by the flux, the flux remaining on the reflective layer is removed at a temperature of 60-180° C. An active substance in the flux is an organic acid, and a volatilization temperature and a decomposition temperature of the organic acid are generally relatively low. A high temperature may effectively volatilize the remaining flux completely, so high temperature baking after welding may improve the problem of lighting up under a low gray scale.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A light emitting device, comprising an underlay substrate, a light emitting functional layer disposed on the underlay substrate, and a reflective layer which is disposed on the underlay substrate and covers at least part of the light emitting functional layer, wherein the reflective layer comprises a first material layer and a second material layer, the first material layer and the second material layer are stacked along a thickness direction of the underlay substrate, the first material layer comprises an atomic crystal material, the first material layer is located at one side of the second material layer away from the underlay substrate, and a surface of the first material layer away from the second material layer is formed as a surface of the reflective layer away from the underlay substrate;

wherein the reflective layer further comprises a plurality of third material layers, and a plurality of the second material layers are provided;

the third material layers and the first material layer comprise a same atomic crystal material, and one of the second material layers is disposed on a surface of the first material layer facing the underlay substrate;

the reflective layer comprises n second material layers, n−1 third material layers, and one first material layer which are stacked, wherein n is an integer greater than 3; and an optical thickness of each of the first material layer, a second material layer, and a third material layer is a quarter of a central reflection wavelength of the reflective layer.

2. The light emitting device of claim 1, wherein the first material layer comprises at least one of aluminum oxide, silicon dioxide, and aluminum nitride.

3. The light emitting device of claim 1, wherein the second material layer comprises a titanium dioxide material.

4. The light emitting device of claim 1, wherein the light emitting functional layer comprises a first semiconductor layer, a quantum well layer, a second semiconductor layer, and a conductive layer disposed in sequence on the underlay substrate, wherein the first semiconductor layer comprises a first portion and a second portion, a vertical projection of the first portion on the underlay substrate overlaps with a vertical projection of the quantum well layer and the second semiconductor layer on the underlay substrate; a vertical projection of the second portion on the underlay substrate does not overlap with the vertical projection of the quantum well layer and the second semiconductor layer on the underlay substrate.

5. The light emitting device of claim 4, further comprising a first electrode and a second electrode, wherein the first electrode is disposed on the second portion of the first semiconductor layer, and the second electrode is disposed on the second semiconductor layer.

6. The light emitting device of claim 5, wherein a vertical projection of the reflective layer on the underlay substrate overlaps with a vertical projection of the first electrode and the second electrode on the underlay substrate.

7. The light emitting device of claim 6, further comprising a first pad and a second pad, wherein the first pad and the second pad are both disposed at one side of the reflective layer away from the underlay substrate, a first via hole and a second via hole are formed in the reflective layer, the first pad is connected to the first electrode through the first via hole, and the second pad is connected to the second electrode through the second via hole.

8. The light emitting device of claim 7, wherein in a first direction of the light emitting device, the light emitting device has a first length, the first length being L, the first pad and the second pad are arranged at intervals in the first direction, a distance between an edge of the first pad close to the second pad and an edge of the second pad close to the first pad is D, and the first length L and the distance D satisfy a relational formula: 33% L≤D≤66% L.

9. The light emitting device of claim 7, wherein an edge of the first pad away from the second pad is flush with an edge of the light emitting functional layer at one side, and an edge of the second pad away from the first pad is flush with an edge of the light emitting functional layer at another side.

10. The light emitting device of claim 1, wherein the light emitting device is a light emitting diode.

11. A light emitting substrate, comprising a drive substrate and the light emitting devices of claim 1 arranged in an array on the drive substrate.

12. A method for preparing a light emitting device, comprising:

forming a light emitting functional layer on an underlay substrate; and forming a reflective layer on the underlay substrate; the reflective layer covers at least part of the light emitting functional layer;

wherein the reflective layer at least comprises a first material layer, the first material layer comprises an atomic crystal material, the reflective layer further comprises a second material layer, the first material layer and the second material layer are stacked along a thickness direction of the underlay substrate, the first material layer is located at one side of the second material layer away from the underlay substrate, and a surface of the first material layer away from the second material layer is formed as a surface of the reflective layer away from the underlay substrate;

wherein the reflective layer further comprises a plurality of third material layers, and a plurality of the second material layers are provided;

the third material layers and the first material layer comprise a same atomic crystal material, and one of the second material layers is disposed on a surface of the first material layer facing the underlay substrate;

the reflective layer comprises n second material layers, n−1 third material layers, and one first material layer which are stacked, wherein n is an integer greater than 3; and an optical thickness of each of the first material layer, a second material layer, and a third material layer is a quarter of a central reflection wavelength of the reflective layer.

13. The method for preparing the light emitting device of claim 12, wherein forming the reflective layer on the underlay substrate comprises:

forming the second material layer of the reflective layer by an atomic layer deposition process.

14. The method for preparing the light emitting device of claim 12, wherein the second material layer comprises a titanium dioxide material, and forming the reflective layer on the underlay substrate comprises:

forming the second material layer of the reflective layer by an electron beam evaporation process, wherein a partial pressure of oxygen is $1\times10^{-2}$ to $5\times10^{-2}$ in a process of depositing the second material layer.

15. A method for preparing a light emitting substrate, comprising:

forming a light emitting device by using the method for preparing the light emitting device of claim 12; forming a first pad and a second pad on the reflective layer of the light emitting device;

welding the first pad and the second pad to a drive substrate respectively through flux; and removing the flux remaining on the reflective layer.

16. The method for preparing the light emitting substrate of claim 15, wherein removing the flux remaining on the reflective layer comprises:

removing the flux remaining on the reflective layer at a temperature of 60-180° C.; or, cleaning and removing the flux remaining on the reflective layer.

* * * * *